(12) United States Patent
Krueger et al.

(10) Patent No.: US 9,236,559 B2
(45) Date of Patent: Jan. 12, 2016

(54) DETERMINATION OF A QUALITY INDUCED TERMINATION RATE OF COMMUNICATION SESSIONS

(75) Inventors: Michael Krueger, Hamburg (DE); Hendrik Scholz, Hamburg (DE); Michael Wallbaum, Hamburg (DE)

(73) Assignee: VoIPFuture GmbH, Hamburg (DE)

( * ) Notice: Subject to any disclaimer, the term of this patent is extended or adjusted under 35 U.S.C. 154(b) by 0 days.

(21) Appl. No.: 14/370,218

(22) PCT Filed: Jan. 5, 2012

(86) PCT No.: PCT/EP2012/000042
§ 371 (c)(1),
(2), (4) Date: Jul. 2, 2014

(87) PCT Pub. No.: WO2013/102469
PCT Pub. Date: Jul. 11, 2013

(65) Prior Publication Data
US 2014/0317288 A1    Oct. 23, 2014

(51) Int. Cl.
*H04L 12/26* (2006.01)
*H01L 43/08* (2006.01)
(Continued)

(52) U.S. Cl.
CPC ............ *H01L 43/08* (2013.01); *H04L 41/5025* (2013.01); *H04L 41/5087* (2013.01);
(Continued)

(58) Field of Classification Search
CPC ..... H04L 43/08; H04L 65/60; H04L 41/5009; H04L 41/5087; H04L 65/80; H04L 43/0829; H04L 43/0858; H04L 65/1059; H04L 65/608; H04L 43/106

USPC ........................ 709/224; 379/1.04, 32.01, 133
See application file for complete search history.

(56) References Cited

U.S. PATENT DOCUMENTS 5,459,777 A * 10/1995 Bassa et al. .................... 379/133
5,883,819 A *  3/1999 Abu-Amara et al. ......... 716/106
(Continued)

FOREIGN PATENT DOCUMENTS

EP         2369807       9/2011
WO    WO 2013/102469    7/2013

OTHER PUBLICATIONS

Egger, Sebastian, et al. "Same but different?—Using speech signal features for comparing conversational VoIP quality studies," Communications (ICC), 2012 IEEE International Conference on. IEEE, 2012.*

(Continued)

*Primary Examiner* — Jimmy H Tran

(57) ABSTRACT

This invention relates to methods and an apparatus for detecting quality induced terminations of media streams of real-time communication sessions within a packet-switched network. To enable the determination of the quality of live media streams passing by the tapping points in a network, and to use this information to determine media transmissions being aborted due to bad quality the invention evaluates quality data records of a terminated media stream to detect, whether the media stream was terminated due to bad quality or another reason. Advantageously, a threshold number of quality data records that were generated for the media stream just before termination thereof are considered in the evaluation. In case each of this threshold number of quality data records yields a bad quality of the media stream, the termination of the media stream may be judged or assumed to be induced due to bad quality.

20 Claims, 5 Drawing Sheets

(51) Int. Cl.
*H04L 12/24* (2006.01)
*H04L 29/06* (2006.01)

(52) U.S. Cl.
CPC ............ *H04L65/1083* (2013.01); *H04L 65/60* (2013.01); *H04L 65/80* (2013.01); *H04L 41/5067* (2013.01); *H04L 43/12* (2013.01)

(56) References Cited

U.S. PATENT DOCUMENTS

| | | | |
|---|---|---|---|
| 5,917,898 A * | 6/1999 | Bassa et al. | 379/133 |
| 5,999,604 A * | 12/1999 | Walter | 379/133 |
| 6,308,216 B1 * | 10/2001 | Goldszmidt et al. | 709/236 |
| 6,381,306 B1 * | 4/2002 | Lawson et al. | 379/32.01 |
| 6,385,204 B1 * | 5/2002 | Hoefelmeyer et al. | 370/401 |
| 6,446,122 B1 * | 9/2002 | Rawat et al. | 709/224 |
| 6,466,985 B1 * | 10/2002 | Goyal et al. | 709/238 |
| 6,631,135 B1 * | 10/2003 | Wojcik | 370/395.21 |
| 6,636,516 B1 * | 10/2003 | Yamano | 370/395.52 |
| 6,647,412 B1 * | 11/2003 | Strandberg et al. | 709/223 |
| 6,748,433 B1 * | 6/2004 | Yaakov | 709/224 |
| 7,352,852 B1 * | 4/2008 | Cocherl et al. | 379/114.02 |
| 7,761,579 B2 * | 7/2010 | Khasnabish | 709/227 |
| 8,085,758 B2 * | 12/2011 | Ramachandran et al. | 370/352 |
| 8,194,640 B2 * | 6/2012 | Ramachandran et al. | 370/352 |
| 8,254,265 B2 * | 8/2012 | Ramachandran | H04L 12/6418 370/238 |
| 8,351,344 B2 * | 1/2013 | Jung et al. | 370/252 |
| 8,547,962 B2 * | 10/2013 | Ramachandran et al. | 370/352 |
| 8,743,870 B2 * | 6/2014 | Ramachandran et al. | 370/352 |
| 8,755,371 B2 * | 6/2014 | Ramachandran et al. | 370/352 |
| 2006/0073786 A1 * | 4/2006 | Sarkar | 455/24 |
| 2006/0146792 A1 * | 7/2006 | Ramachandran | H04L 12/6418 370/352 |
| 2006/0203738 A1 | 9/2006 | Fok et al. | |
| 2006/0239255 A1 * | 10/2006 | Ramachandran et al. | 370/352 |
| 2008/0112549 A1 * | 5/2008 | Yoon et al. | 379/114.06 |
| 2008/0249843 A1 * | 10/2008 | Gross | 705/10 |
| 2009/0034426 A1 * | 2/2009 | Luft et al. | 370/252 |
| 2009/0135839 A1 * | 5/2009 | Khasnabish | 370/401 |
| 2010/0135171 A1 * | 6/2010 | Jung et al. | 370/252 |
| 2010/0232314 A1 * | 9/2010 | El-Hennawey et al. | 370/252 |

OTHER PUBLICATIONS

Yusoff, Norzailah Binti Mohd. "Performance evaluation of qos provisioning techniques for voip." Information and Communication Technologies, 2006. ICTTA'06. 2nd. vol. 2. IEEE, 2006.*
International Search Report and the Written Opinion Dated Sep. 11, 2012 From the International Searching Authority Re. Application No. PCT/EP2012/000042.

* cited by examiner

DETERMINATION OF A QUALITY INDUCED TERMINATION RATE OF COMMUNICATION SESSIONS

RELATED APPLICATIONS

This application is a National Phase of PCT Patent Application No. PCT/EP2012/000042 having International filing date of Jan. 5, 2012, the contents of which are incorporated by reference as if fully set forth herein in their entirety.

FIELD OF THE INVENTION

This invention relates to methods and an apparatus for detecting quality induced terminations of media streams of real-time communication sessions within a packet-switched network.

Furthermore, the invention also generally relates to a passive monitoring system making use of the principles of the invention.

TECHNICAL BACKGROUND

VoIP Services

Voice over IP ("Voice over IP"—IP denoting the Internet Protocol) networks are packet-switched phone networks. In contrast to their circuit-switched predecessors (e.g. the PSTN) the control plane (signaling information—who calls whom) may use a different path through the network than the media plane (media—the call content). The media plane is sometimes also referred to as the user plane. VoIP services can be considered to consist of a signaling plane and a media plane. On the signaling plane various protocols describe the communication session (call) flow in terms of involved parties, intermediary VoIP entities (i.e. VoIP proxies, routers) and the characteristics of the VoIP service features. The media plane typically carries the media information (i.e. audio and/or video data) between the involved parties. Neither the media plane nor the signaling plane alone is sufficient to implement and provide a VoIP service. On the signaling plane protocols like SIP (see IETF RFC 3261, "SIP: Session Initiation Protocol", available at http://wwwdotietfdotorg) or ITU-T recommendation H.323 (see H.323, "Packet-based multimedia communications systems", Edition 7, 2009, available at http://wwwdotitudotint) are commonly used, whereas protocols like RTP (Real-time Transport Protocol, see IETF RFC 3550, "RTP: A Transport Protocol for Real-Time Applications", available at http://www.ietf.org), MSRP (see IETF RFC 4975, "The Message Session Relay Protocol (MSRP)", available at http://www.ietf.org) or ITU recommendation T.38 (see T.38, "Procedures for real-time Group 3 facsimile communication over IP networks", Edition 5 (2007) or Edition 6 (2010), available at http://wwwdotitudotint) may be present on the media plane.

In contrast to the traditional PSTN (Public Switched Telephone Network) network both planes may be on different infrastructure using different protocols and even take different routes through a network.

Quality Monitoring in of Communication Sessions in Packet-Switched Networks

Network operators offering communication sessions, e.g. VoIP calls, need to monitor the service they offer. Typically this is done on the control plane as monitoring the media plane is generally considered more complex. For both of the monitoring methods a multitude of key performance indicators (KPI) are available. The answer seizure ratio (ASR) for instance is one of the most basic control plane KPIs. By comparing the number of call attempts to the number of successful calls an indication on the network performance and availability can be given.

User plane KPIs describe aspects of the conversational quality of a call. For example, a KPI may reflect the IP transport characteristics of the user plane by means of determining a mean opinion score (MOS) value or the rate of standard conformance violations determined by performing media payload in-depth analysis. Analysis of the actual media payload is computationally expensive and may be considered a breach of the confidentiality of the conversation.

To deduct media quality-related information from the control plane (i.e. without actually looking at the user plane) a simple assumption is made: If the call quality is unacceptable the parties will hang up the call. This call hangup can be monitored on the control plane. On the control plane the reason for the call termination cannot be determined as one of the involved parties simply hung up the call—which is also true for calls with acceptable media quality. Providers may use the average call duration (ACD) KPI which monitors the average call duration of calls. This is also known as mean holding time (MHT) or average length of call (ALOC). If the ACD KPI value drops below a certain threshold the service provider may investigate is the reason. However, the average call duration is not solely dependent on media quality. Other influencing factors include time of day, call destination or control plane issues.

Pure control plane solutions fail to identify unacceptable media quality as reason for call termination as there is no means to signal quality-related hangup causes. Features such as the Q.850 Reason code (see IETF RFC 3326, "The Reason Header Field for the Session Initiation Protocol (SIP)", available at http://wwwdotietfdotorg) are only available during the call setup. The network is not able to distinguish between a call where a party hangs up because the conversation is over and a call in which a party ends the conversation due to bad quality and consequently hangs up.

Some operators try to compensate for this by simply looking at the average duration of the calls (ACD). If the average call duration decreases below an artificial threshold the operator may start troubleshooting in order to locate problematic calls and fix potential network issues. The problem with the ACD calculation is that is requires numerous calls over a longer period of time to for instance calculate the average call duration of calls within a 15 minute interval. This means that any deviation may only be visible after 15 minutes. Legitimate calls which just happen to be very short do have a negative impact on the ACD calculation and may trigger a false alarm. Announcements with less than 10 second call hold time are a good example for this category of calls.

More sophisticated solutions may take the user plane into account. A MOS value may be delivered by the endpoint through an RTCP report. A passive midpoint monitoring solution may determine a MOS value for the media streams of a given call. Active monitoring solutions which conduct artificial calls may also provide information on quality problems of the media plane, though such information need not be valid for individual real calls made by actual service users.

MOS values provided by either endpoints or passive midpoint solutions have to fulfill certain conditions. MOS values provided by endpoints may not be trustworthy as the end customers have an incentive to forge wrong reports and artificially report bad voice quality so that they do not have to pay for their calls. Moreover, MOS values provided by both endpoints and passive midpoint solutions need to have a high granularity in order to be useful for this application. An average MOS value over several minutes would not show a significant impact if only the last few seconds have been impaired. Even a three minute call with a MOS score of 4.41 would only degrade to a MOS score of 4.22 if the last 10 seconds where inaudible (MOS score of 1 assumed). An average MOS score of 4.11 would still be considered very good and would fall in the highest MOS class specified by Recommendation ITU-T G.107, "The E-model: a computational model for use in transmission planning", April 2009 (available at http://wwwdotitudotint).

Active Vs. Passive Monitoring of Communication Sessions in Packet-Switched Networks VoIP monitoring solutions available in the market fall into two main categories, which are active monitoring system and passive monitoring system. The fundamentally different monitoring approaches have their respective applications, but are not interchangeable.

Active monitoring solutions basically work with a sender and a receiver device, with the network infrastructure to be tested in between. That makes active testing much easier since the information transmitted by the sender device is known. The receiving device can easily compare the received signal with the known sender signal and analyze any differences. It is clear that the network must have introduced any monitored impairments, since sender and receiver device can be assumed to be ideal, standard compliant and free of errors.

Active testing is usually a good choice when pretesting of network infrastructure has to be done, i.e. when there are no other active media stream transmitters in the network deployed yet. Another application for active testing is to perform basic availability testing as well as one-way delay measurements. Active testing can be used to automatically detect the availability of specific segments of a complex network infrastructure, or to test the availability and response times of major infrastructure equipment dedicated to media transmission.

Since network impairments are of transient nature and because active testing does not consider the end user equipment used to transmit and receive media streams, active testing is no option when it comes to 24/7 monitoring of VoIP services at call service providers. This is where passive monitoring solutions play a major role.

Passive monitoring of media streams to assess their quality as well as to determine if problems originate on the sender or network part of the transmission path is different, as neither the sending nor the receiving endpoints are under the control of the monitoring system. All quality evaluation performed by passive solutions must be derived from the packets passing by the tapping point to which the monitoring probe is attached. Passive monitoring system will be decoupled from the network under test and may only receive copies of packets. Passive systems are not actively taking part in the traffic carried over the tested network. No additional traffic is introduced, which provides a straight view on the transmission performance of the monitored network infrastructure.

Drawbacks of passive monitoring solutions are that they have no information about the sender or receiver of the media streams as well as their error correction capabilities. Also quality information is not collected end-to-end but is provided as if the receiver would be located at the tapping point to which the passive monitoring probe is attached. The last point can however also become an advantage if multiple passive probes are installed along the transmission path, because in that case more, fine grained information becomes available. In that case locating network segments introducing impairments becomes more easily possible.

SUMMARY OF THE INVENTION

One object of the invention is to enable the determination of the quality of live media streams passing by the tapping points in a network (passive monitoring system), and to suggest an advantageous usage of this information to determine (a ratio of) media transmissions being aborted due to bad quality.

Another object of the invention is to offer an early warning indication that the monitored live media streams are impaired even before call terminations due to bad quality occur.

At least one of these objects is solved by the subject matter of the independent claims. Advantageous embodiments of the invention are subject to the dependent claims.

One of the various aspects of the invention is to enable to detect quality induced terminations of media streams of real-time communication services within (a link of) a packet-switched network. For this purpose, quality data records of a media stream which has been terminated are evaluated to detect, whether the media stream was terminated due to bad quality or not (another reason). Advantageously, a threshold number of quality data records that were generated for the media stream just before termination thereof are considered in the evaluation. In case each of this threshold number of (lastly generated) quality data records yields a bad quality of the media stream, the termination of the media stream may be judged or assumed to be induced due to bad quality.

According to a further aspect, the judgment of whether the termination of media streams was quality induced or not allows for the definition of a key performance indicator of the monitored live media stream. This key performance indicator allows for an accurate determination of the ratio of media transmissions being aborted due to bad quality. The key performance indicator indicating the quality induced termination rate of media streams is also referred to as the QUIT (QUality Induced Termination) ratio or rate herein.

A further aspect of the invention is the correlation of media streams and the communication session they belong to, which in turn allows defining a key performance indicator for the number of communication sessions (e.g. telephone calls, conference calls, video-conferencing sessions, etc.) that were terminated by either party due to bad quality.

One exemplary embodiment of the invention provides a method for detecting quality induced terminations of media streams of real-time communication sessions within a packet-switched network. In this method a passive monitoring system monitors a plurality of media streams. This monitoring comprises generating, for pre-configured time intervals, quality data records for each monitored media stream. Each quality data record is thereby indicative of an estimated media stream quality of the respective media stream within the respective pre-configured time interval.

In response to detecting termination of one of the media streams, a quality induced termination of the one terminated media stream is determined, in case a predetermined threshold number of the lastly generated quality data records for the one terminated media stream are indicative of an estimated media stream quality below a media stream quality threshold level—otherwise the termination of the respective media stream may be determined to not be quality induced.

In one more detailed exemplary embodiment of the invention monitoring of the plurality of media streams received by the real-time passive monitoring system comprises determining transport-related metrics for each of the media streams for respective pre-configured time intervals. Moreover, the media stream quality for each of the media streams is estimated within each respective pre-configured time interval.

In an exemplary embodiment, the estimated media stream quality is an estimated speech quality. However, the invention is not limited thereto. The speech quality could be for example expressed in terms of a Mean Opinion Score (MOS) or R-factor value.

In another exemplary embodiment of the invention, estimating the media stream quality comprises determining a Mean Opinion Score (MOS) or R-factor value for each media stream in each pre-configured time interval, and a quality induced termination of a media stream is determined based on the Mean Opinion Score (MOS) or R-factor value.

Moreover, in a further embodiment of the invention, estimated media stream quality is an estimated transport quality. The transport quality can be for example determined based on one or more of the following transport metrics: packet loss, jitter, deviations in packet inter-arrival times, packet delay, sequence errors in the received packet sequence, etc.

In a further embodiment of the invention the media stream termination ratio of the number of media streams, the termination of which is determined to be quality induced, and the number of media streams, the termination of which is not determined to be quality induced, is calculated. This ratio may be used to generate an alert, e.g. in case the media stream termination ratio exceeds a predetermined termination ratio.

Optionally, the media stream termination ratio could be calculated for media streams conveying certain content. For example, the ratio may only take into account media streams that convey video data only or media streams that convey voice data only. Of course, it would also be possible that the media stream termination ratio is calculated taking into account media stream that convey video data and media streams that convey audio data.

Moreover, in another embodiment of the invention, the media stream termination ratio is calculated in intervals. The ratio could be for example calculated every given number of minutes for the media streams (or selected media streams thereof) that terminated within the last given number of minutes. For instance, the ratio could be calculated for 5 minute intervals, 10 minute intervals, 12 minute intervals, 15 minute intervals or 20 minute intervals or 30 minute intervals. Alternatively, the media stream termination ratio could be calculated in response to a configurable or pre-determined number of media stream terminations.

In a further embodiment of the invention, a media stream context is maintained for each media stream. A quality induced termination indicator that indicates whether termination of the respective media stream has been determined to be quality induced or not is added to the media stream context upon termination of the respective media stream. This key performance indicator may be used for further analysis on the speech quality or overall performance within the monitored (link of the) packet-switched network.

In one more specific exemplary implementation, it can be assumed that the monitored media streams belong to different communication sessions. According to this implementation the method could further include correlating for each terminated communication session the media stream contexts of the media streams belonging to each respective terminated communication session. This would enable to judge, for each terminated communication session, the termination of a respective communication session to be quality induced, in case at least one media stream context of a media stream being active upon termination of the respective terminated communication session indicates a quality induced termination, and, otherwise, to judge the termination of the respective communication session not to be quality induced.

In case the media streams are correlated to their services a communication session termination ratio of the number of communication sessions the termination of which is judged to be quality induced, and the number of communication sessions, the termination of which is judged not to be quality induced, can be calculated. The calculation of the ratio (or rate) for communication sessions instead of media streams allows for a more accurate determination of quality induced terminations of communication sessions in the monitored (link of) the packet-switched network. The determination of the communication session termination ratio may be used to generate an alert, e.g. in case the communication session termination ratio exceeds a predetermined termination ratio.

As mentioned above for the media stream termination ratio, also the communication session termination ratio could be for example calculated every given number of minutes for the communication sessions (or selected communication sessions thereof) that terminated within the last given number of minutes. For instance, the ratio could be calculated for 5 minute intervals, 10 minute intervals, 12 minute intervals, 15 minute intervals or 20 minute intervals or 30 minute intervals. Alternatively, the communication session termination ratio could be calculated in response to a configurable or pre-determined number of communication session terminations. Optionally, the ratio could also be calculated per service type or for individual, e.g. user selectable, service types only.

In another exemplary embodiment of the invention, the media stream context may further comprise quality data records of a respective terminated media stream that indicate the estimated speech quality for the respective predetermined time interval of a respective quality data record to be below the quality threshold level. When determining a quality induced termination of the one terminated media stream it may be determined whether there is a predetermined number of lastly generated and consecutive quality data records comprised in the media stream context of the one terminated media stream that each indicate the estimated speech quality to be below the quality threshold, and if so, it is determined that the termination of the one terminated media stream is quality induced.

In one exemplary embodiment of the invention, the method for detecting quality induced terminations of media streams of real-time communication services within a packet-switched network comprises (e.g. as part of the monitoring) determining, upon the generation of a new quality data record for a respective media stream of the plurality of media streams, whether the estimated media stream quality of the respective media stream indicated by the new quality data record is below the quality threshold level or not. In case the estimated media stream quality of the respective media stream indicated by the new quality data record is below the quality threshold level, a counter value for the respective media stream is incremented. Otherwise, i.e. in case the estimated media stream quality of the respective media stream indicated by the new quality data record is not below the quality threshold level, the counter value is reset (e.g. set to zero). A quality induced termination of the one terminated media stream is determined, in case the counter value for the respective terminated media stream is higher than the predetermined threshold number.

Of course, alternatively, the counter value could also be initiated (and reset) to a predetermined value and could be decremented every time the estimated media stream quality of the respective media stream indicated by the new quality data record is below the quality threshold level. A quality induced termination of the one terminated media stream would be determined in this case, if the counter value would then be equal or below a given threshold (e.g. zero).

In a further more detailed and exemplary implementation, the media stream context further comprises quality data records of a respective terminated media stream that indicate the estimated media stream quality for the respective pre-configured time interval of a respective quality data record to be below the quality threshold level.

In one further embodiment of the invention, the pre-configured time intervals in which quality data records are generated for the plurality of media streams are time aligned for the plurality of media streams.

Furthermore, another aspect of the invention is related to implementing the method for detecting quality induced terminations of media streams of real-time communication services within a packet-switched network according to one of the various embodiments described herein in hardware and software, or a combination thereof. The method can be implemented on a single monitoring device or a combination of network elements. Some tasks of the method may be also performed on a post-processing platform based on a database containing the stream context information (and optionally quality data records) of the terminated communication sessions.

Accordingly, one embodiment of the invention provides an apparatus for detecting quality induced terminations of media streams of real-time communication services within a packet-switched network. The apparatus comprises a monitoring unit for monitoring a plurality of media streams, wherein monitoring unit is adapted to generate, for pre-configured time intervals, quality data records for each monitored media stream, wherein each quality data record is indicative of an estimated media stream quality of the respective media stream within the respective pre-configured time interval.

The apparatus may also include a determination unit for determining, in response to detecting termination of one of the media streams, a quality induced termination of the one terminated media stream, in case a predetermined threshold number of the lastly generated quality data records for the one terminated media stream are indicative of an estimated media stream quality below a media stream quality threshold level.

For example, the monitoring unit could comprise a network interface card to receive data packets of the media streams and one or more processors that are capable of processing the data packets. The determination unit could be for example implemented using one or more of the before mentioned processors or alternatively another one or more processors specially dedicated to this task.

In one embodiment of the invention, the apparatus is implemented in or is a monitoring probe or a session border controller (SBC).

As mentioned above, it is however also possible to implement the functionality across multiple devices. Accordingly, another embodiment of the invention is providing a passive monitoring system for detecting quality induced terminations of media streams of real-time communication services within a packet-switched network. The system comprises one or more monitoring units for monitoring a plurality of media streams, wherein monitoring unit is adapted to generate, for pre-configured time intervals, quality data records for each monitored media stream, wherein each quality data record is indicative of an estimated media stream quality of the respective media stream within the respective pre-configured time interval. Moreover, the system could also include a determination unit for determining, in response to detecting termination of one of the media streams, a quality induced termination of the one terminated media stream, in case a predetermined threshold number of the lastly generated quality data records for the one terminated media stream are indicative of an estimated media stream quality below a media stream quality threshold level.

In one exemplary embodiment, the monitored media streams belong to different communication sessions and the system further comprises a correlation unit adapted to correlate for each terminated communication session the media stream contexts of the media streams belonging to each respective terminated communication session. Moreover, the system could be provided with a processing unit adapted to judge, for each terminated communication session, the termination of a respective communication session to be quality induced, in case at least one media stream context of a media stream being active upon termination of the respective terminated communication session indicates a quality induced termination, and, otherwise, judging the termination of the respective communication session not to be quality induced, and a calculation unit adapted to calculate the communication session termination ratio of the number of communication sessions the termination of which is judged to be quality induced, and the number of media streams, the termination of which is judged not to be quality induced. Further, the system could also comprise an alarm generation unit adapted to generate an alert in case the communication session termination ratio exceeds a predetermined termination ratio.

The different aspects of the invention may also be implemented in software by means of executable instructions. A further embodiment therefore provides a computer-readable medium storing instructions that, when executed by a processor of an apparatus, cause the apparatus to detect quality induced terminations of media streams of real-time communication services within a packet-switched network, by monitoring by a passive monitoring system a plurality of media streams, wherein monitoring comprises generating, for pre-configured time intervals, quality data records for each monitored media stream, wherein each quality data record is indicative of an estimated media stream quality of the respective media stream within the respective pre-configured time interval, and determining, in response to detecting termination of one of the media streams, a quality induced termination of the one terminated media stream, in case a predetermined threshold number of the lastly generated quality data records for the one terminated media stream are indicative of an estimated media stream quality below a media stream quality threshold level.

The computer-readable medium according to another embodiment of the invention is further storing instructions that, when executed by the processor, cause the apparatus to perform the steps of the method for detecting quality induced terminations of media streams of real-time communication services within a packet-switched network according to one of the various aspects and embodiments of the invention.

BRIEF DESCRIPTION OF THE FIGURES

In the following the invention is described in more detail in reference to the attached figures and drawings. Similar or corresponding details in the figures are marked with the same reference numerals.

DETAILED DESCRIPTION OF THE INVENTION

Figure 1:
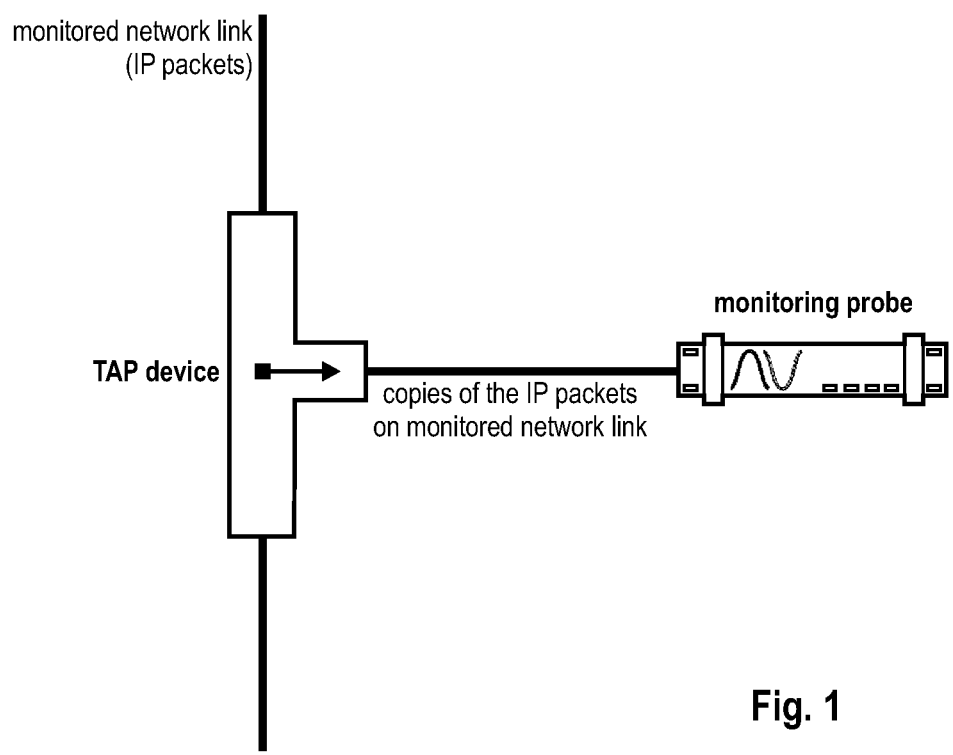
FIG. 1 shows how IP packets are forwarded as a packet copy produced by a tapping device to the passive monitoring probe for the purpose of passive quality monitoring of media streams in packet-switched networks.

The following paragraphs will describe various embodiments of the invention. For exemplary purposes only, most of the embodiments are outlined in relation mainly to VoIP calls as an example for a communication session, but the invention is not limited to VoIP calls. For example, the invention may also be used for other types of communication sessions (e.g. video games, video streaming, IPTV broadcasting, etc.) provided in packet-switched networks. The invention may be advantageously used in communication sessions which have signaling plane and media plane separated and/or taking different routes through the packet-switched network.

The explanations given in the Technical Background section above are intended to better understand the mostly VoIP specific exemplary embodiments described herein and should not be understood as limiting the invention to the described specific implementations of processes and functions in a packet-switched communication network.

One of the aspects of the invention is to detect quality induced terminations of media streams of real-time communication services within (a link of) a packet-switched network. For this purpose, quality data records of a media stream which has been terminated are evaluated to detect, whether the media stream was terminated due to bad quality or not (terminated due to another reason). Advantageously, a threshold number of quality data records that were generated for the media stream just before termination thereof are considered in the evaluation. In case each of this threshold number of (lastly generated) quality data records yields an (estimated) bad quality of the media stream, the termination of the media stream may be judged to be induced due to bad quality. The expression estimated is used to highlight that the media stream quality is indeed only an estimation of the media stream's quality, since it is determined based on transport metrics.

According to a further aspect, the judgment of whether the termination of media streams was quality induced or not allows for the definition of a key performance indicator of the monitored live media stream. This key performance indicator allows for an accurate determination of the ratio of media transmissions being aborted due to bad quality. The key performance indicator indicating the quality induced termination rate of media streams is also referred to as the QUIT (QUality Induced Termination) indicator herein.

A further aspect of the invention is the correlation of media streams and the communication session they belong to, which in turn allows for define a key performance indicator of the number of communication sessions (e.g. telephone calls, conference calls, video-conferencing calls, etc.) that were terminated by the parties due to bad quality.

Generally, a communication session can be considered to consist of a media plane and a signaling plane. The media plane of the communication session is formed by media streams, while the signaling plane is formed by a signaling session. As will become apparent from the following, information from the signaling session need not to be considered for the determination of quality induced terminations of media streams. However, information of the signaling session may be used for detecting the media streams belonging to a communication session, which is an aspect in some of the embodiments of the invention described in the following.

Each media stream consists of (data) packets that are sent from a source (e.g. a transmitting terminal) to a sink (e.g. receiving terminal). Please note that media streams are sometimes also referred to as packet streams in the following. The media streams convey media data, e.g. audio data—including speech data—(audio stream) or video data (video stream). Typically, multiple media streams belong to a single communication session. A communication session may thus have one or more audio stream and/or one or more video stream, e.g. one media stream for each direction of a voice call (caller-to-callee and callee-to-caller).

In one embodiment, the data packets of the media streams and subjected to the monitoring are RTP packets. According to the OSI (Open System Interconnection) reference model, RTP packets are typically considered to belong to the session layer and may be transported over various transport protocols (typically UDP but other protocols such as TCP and SCTP may be used) and an IP protocol (IPv4 or IPv6) in the network layer. When monitoring the data packets of the media streams of the communication sessions, transport metrics may include information from the session layer, transport layer and the network layer.

For a typical VoIP session (often also referred to as a "call"), the media plane may for example comprise a single audio stream in each direction. A conference call may for example comprise multiple audio streams of the participants. A video conference may in turn include multiple audio streams and video streams of the participants.

Moreover, it should also be noted that during an ongoing communication session, new media streams may be added/forked (e.g. a new participant enters the conference call, an call with audio streams is "upgraded" to a video conferencing session by adding video streams, etc.) or terminated (e.g. due to codec changes, a participant of a conference call hangs up, etc.), so that the number of media streams may change over time of a session. In modern telephone networks, also ringtones are typically delivered via media streams, so there may be multiple media streams for ringtones if a call is forwarded to multiple VoIP telephone terminals, which are then terminated once the call is answered, while adding the audio stream to convey the speech data from the VoIP telephone terminal where a user answers the call.

It is possible, but not mandatory, that the packets of a media stream are isochronous, i.e. the sending source is generating packets in fixed time intervals. For instance, in VoIP calls, RTP packets are typically generated in fixed intervals, which are between 5 ms and 90 ms long. Often a packet interval of 20 ms, 30 ms or 40 ms is encountered in VoIP calls, but the invention is not limited to these values.

In the following, various exemplary embodiments of the invention will be described with respect to a passive monitoring system that is monitoring the packets of multiple media-streams of different sessions on a network link and that is processing/evaluating the received packets in real-time to conclude on an estimated media stream quality of each media stream. The passive monitoring system may for example comprise one or more monitoring components (apparatuses), which could be for example a monitoring probe connected to a monitored network link through a TAP (and receives copies of the packets on the network link for evaluation) or network elements that are terminating a monitored network link, e.g. a session border controller (SBC) or a media gateway (MGW) or any network element that is protocol aware for RTP packets, so that it could act as a monitoring device.

In the following, the aspects of the invention will be exemplarily outlined with respect to a passive monitoring system, in which one or more monitoring probes monitor data packets of media streams received on respective networks links of a packet-switched network and derives transport metrics of the individual monitored packet streams, based on which the quality of the media streams can be estimated. As noted above, the use of monitoring probe(s) is only exemplary, but the described functionality may also be implemented on other network equipment, e.g. a session border controller or the like. The passive monitoring system provides passive access to the monitored network traffic.

Communication sessions monitored by the passive monitoring system are communication sessions that can be for example established by the VoIP protocol suite. Since focus is on the media plane of the services, the following discussion will mainly concentrate on the media streams of the services, which may be for example transported by means of the RTP protocol. Moreover, it may be assumed that UDP is used for data transport in the transport layer (other protocols such as TCP and SCTP may also be used) and an IP protocol (IPv4 or IPv6) in the network layer.

Passive access to the IP packets of the media streams can be for example provided by installing a TAP (test access port) device into the network. The TAP device creates a copy of every IP packet it encounters on the network and offers this copy to an attached monitoring probe. FIG. 1 is showing the schematic installation of a TAP in the network. The TAP usually offers two network interfaces to the attached monitoring probe. The interfaces are providing separated reception and transmission traffic to the probe. Monitoring probes that are connected to a network via a TAP device are not able to inject traffic to the monitored network link. The setup can be thought of as read-only access to the IP packet streams for both directions of the communication link.

The passive monitoring system discussed herein may be capable of monitoring the signaling plane and media plane traffic of the services. For most embodiments of the invention, it is however sufficient to monitor the media plane traffic only. The passive monitoring system allows—inter alia—detecting the data packets carrying media payload, such as for example audio data (e.g. voice/speech) or video data. The media payload of the media streams is typically transported using RTP packets. Therefore, RTP packets within the IP packet stream on each link are filtered for further processing. The passive monitoring system may further de-fragment media payload which is split into multiple fragments or segments and process media payload which is encapsulated in tunneling protocols (e.g. VLANs, MPLS, GRE/GTP tunnels).

The monitoring probe may for example apply a special packet filter to the IP packets it is processing in order to detect those IP packets encapsulating RTP packets in their payload. The detection/filtering mechanism for RTP packets is advantageously based on the RTP definition of RFC 3550 which explains the RTP packet header in great detail. Furthermore, it is assumed for exemplary purposes that the media data is transported using the UDP protocol in the transport layer.

Optionally, the detection of media packets could also consider IP packets transported via the other protocols than UDP protocol in the transport layer.

Figure 2:
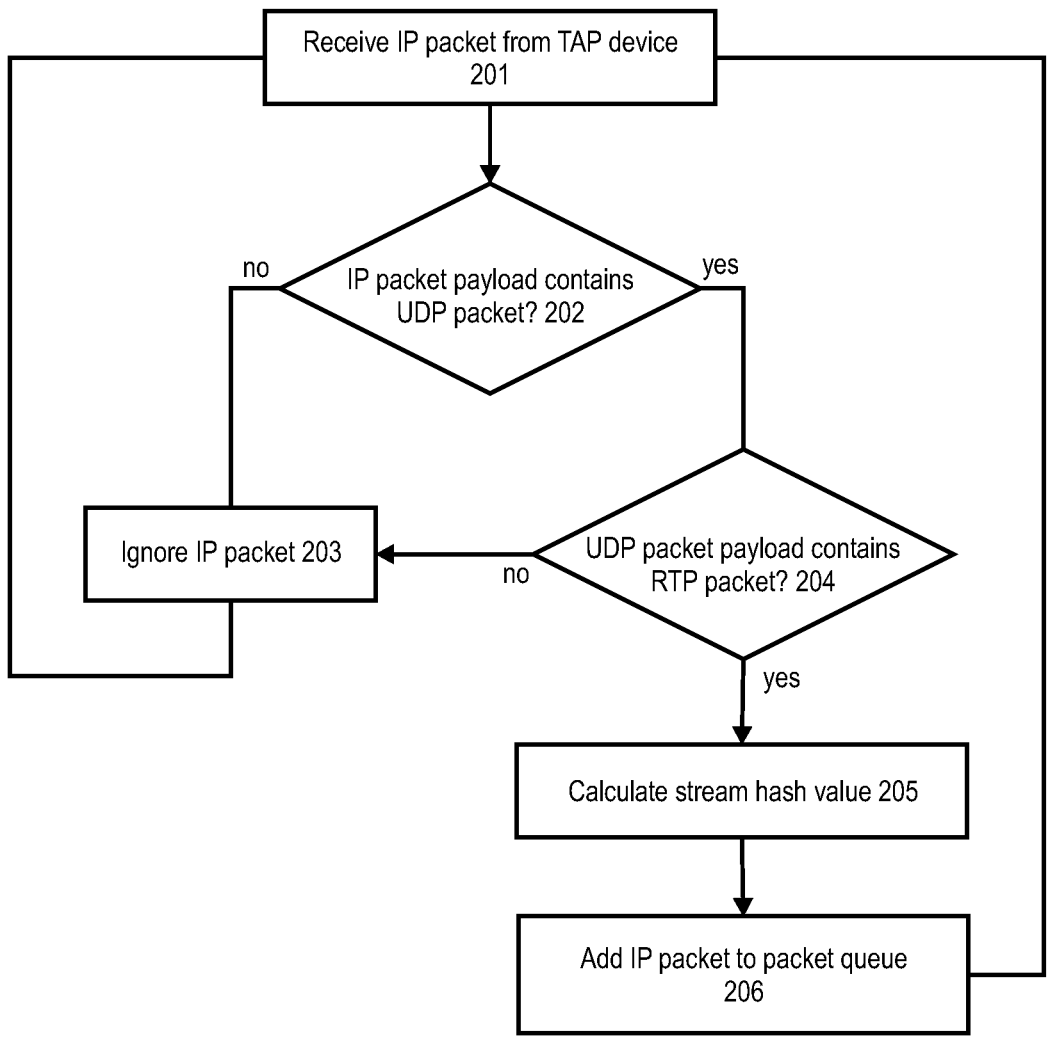
FIG. 2 shows a flow chart according to an embodiment of the invention to illustrate how a monitoring probe according to an embodiment of the invention applies a filter chain to filter and enqueue RTP packets out of the continuous stream of IP packets provided by the tapping device and prepares the filtered RTP packets for processing in the context of a media stream.

A flow chart of a detection mechanism for filtering RTP packets according to an exemplary embodiment of the invention is shown in FIG. 2. The detection mechanism ensures that the fields of the 12-byte RTP header are available and contain expected data.

For each IP packet received 201 from the TAP the monitoring probe may determine 202 first, whether the IP packet is encapsulating an UDP packet. This can be achieved for example by detecting a UDP header in the payload section of the IP packet. If the IP packet does not contain a UDP payload, then the IP packet is ignored 203 (e.g. deleted). Otherwise, it is next checked 204, whether there is an RTP header within UDP payload of the IP packet. If this is not the case, the IP packet is also ignored 203. It should be noted that this processing of the IP packets can be also easily adapted to consider other transport protocols. For example, if IP packets that are transported via TCP or SCTP should be filtered in addition to or alternatively to those transported in via UDP, step 202 can be adapted to also check the IP packets payload for other headers, like TCP headers and/or SCTP headers.

Otherwise, i.e. in case it is ensured that the packet in question is really a RTP packet, a hash value may be calculated 205 over packet fields, which remains constant over the duration of the media stream. This step is however optional and may only be required in certain more sophisticated implementations, as will be explained below. The values used to calculate the stream hash may be for example:

- Source-Tuple: The source tuple (source IP address and port number) is identifying the origin of the media stream and remains constant for the duration of the stream.
- Destination-Tuple: The destination tuple (destination IP address and port number) is identifying the receiver of the media stream and remains constant for the duration of the stream.
- SSRC: This value from the RTP header is chosen by the originator of the media stream and must remain constant for the duration of the stream.

Moreover, if the packet is routed on a specific VLAN (Virtual Local Area Network), the VLAN identifier (VLAN ID) is also considered in the calculation of the hash value, since the same IP addresses may be used on different VLANs. Moreover, if RTP packets transported via different transport protocols are to be filtered, the stream hash value may also take into account a transport protocol identifier, which identifies the transport protocol, e.g. UDP, TCP or SCTP. Similarly other tunnel protocol identifiers may be incorporated into the hash value calculation.

The above fields from any RTP packet are sufficient to be able to associate the packets to their corresponding media streams. On purpose it is referred to media streams and not to calls or communication sessions, since a call/session can have multiple media streams associated to it.

Finally, the IP packet is added 206 to a packet queue for further analysis. Another possibility would be to make use of multiple packet queues, which can be individually further processed. This may be for example advantageous in multi-core server architectures.

Figure 3:
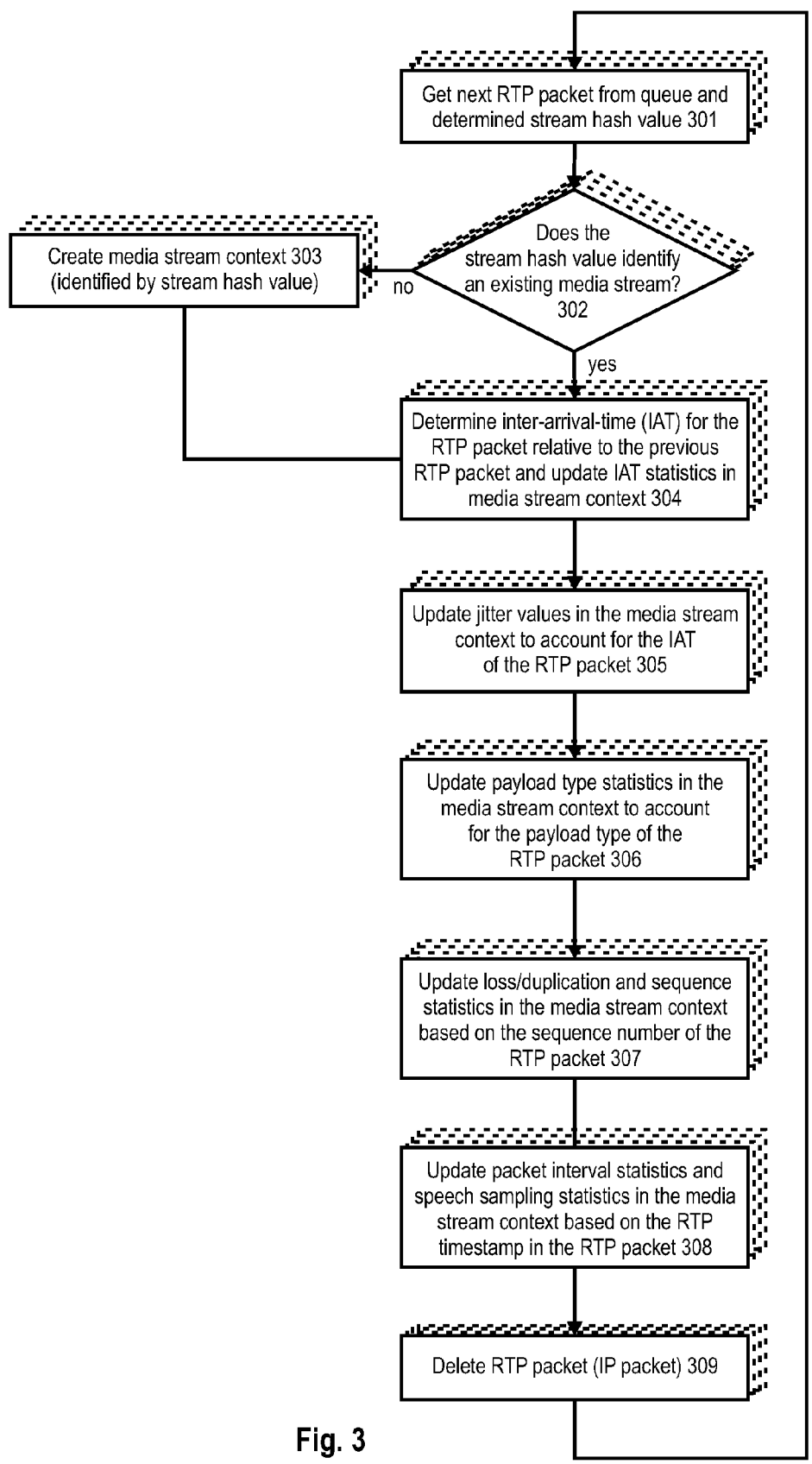
FIG. 3 shows a flow chart according to an embodiment of the invention to illustrate how received RTP packets can be associated with a media stream and can then be evaluated on their impact on transport quality in the context of preceding RTP packets of the same media stream.

IP packets of multiple media streams may be added to a single queue, as long as all IP packets belonging to a media stream are added to the same packet queue. In this latter case, each IP packet in each packet queue would need to be first associated to its media stream (context) when further processing it. This is shown in FIG. 3 part 301 and 302.

Once RTP packets have been added 206 to a packet queue, transport metrics of the media stream are determined from/updated based on the received IP packets and the media stream quality is estimated for the individual streams. High processing performance can be achieved by processing the IP packets in multiple packet queues in parallel from this point on, taking full advantage of today's multi core server architectures.

According to an embodiment of the invention, processing of the RTP packets inspects each RTP packet upon arrival, and estimates its impact on quality in the context of previously received RTP packets of the same media stream. As noted above, the individual data packets can be correlated to their media stream by means of the stream hash value. After determination or updating the transport metrics of a media stream taking into account an RTP packet thereto, the RTP packet may be discarded. This allows a high number of concurrent media streams being processed in "real-time" without imposing high demands on memory utilization.

The analysis of the media stream may be considered to have two parts. During the first part of media stream analysis, all information regarding the single RTP packet is processed. This includes the determination, respectively, update of metrics of the media stream related to the transport of the RTP packets on the network. As exemplified in FIG. 3, this media stream analysis performed on the individual RTP packets of the media stream can for example include (but is not necessarily limited to):

Evaluation of the packet inter-arrival time compared to the last received RTP packet,
Determining jitter based on the inter-arrival time,
Evaluating the RTP header:
   Analyzing payload type,
   Analyzing sequence number to determine packet losses, packet duplicates and reordering events,
   Analyzing RTP timestamp to determine packet interval and speech sampling.

It should be noted again that this first analysis part can still be implemented independent of the time interval for estimating the quality of the respective media streams.

In FIG. 3 (and the other figures) the broken rectangles are intended to indicate that the media stream analysis can be performed for individual media streams in parallel, e.g. in a multi-core architecture in the monitoring probe allows to do so. Generally, the IP packets which are found to contain a RTP packet by the filtering mechanism outlined with respect to FIG. 2 are denoted RTP packets in FIG. 3 for simplicity. However, it should be understood that not only the RTP packets but also the IP header and UDP (or any other transport protocol) header information of the IP packet, respectively UDP packet encapsulating the RTP packet may be available for processing.

The media stream context of a respective media stream (identified by a respective stream hash value as outlined above) may also be considered to comprise a packet queue in which the RTP packets of the media stream are buffered for further processing. Accordingly, the monitoring probe receives 301 a next RTP packet from a packet queue and calculates the stream hash value for the RTP packet. The stream hash value may be calculated for the RTP packet as exemplified above. Before the mechanism shown in FIG. 3 determines and updates transport metrics of the media stream based on the individual RTP packets, it is first checked 302, whether there already exists a media stream context which is associated to the stream hash value of the currently processed RTP packet. If there is no media stream context (i.e. there has been no RTP packet of this media stream processed before), the media stream context is created 303, before steps 304 to 308 are performed Subsequently the RTP packet is processed according to steps 304 to 308. It should be noted that is not necessary to perform all of steps 304 to 308. Furthermore, it is also possible that the steps 304 to 308 are performed in another order. In principle, steps 304 to 308 determine and update transport metrics of the media stream based on the individual RTP packets, based on which a transport quality or a media quality can be determined in the second part of the analysis of the media stream, as outlined below.

In the example shown in FIG. 3, the monitoring probe exemplarily determines 304 the inter-arrival time (IAT) of the RTP packet relative to the previously processed RTP packet and stores this IAT in the media stream context, e.g. by updating an IAT histogram according to the determined IAT for the RTP packet. For this purpose, each RTP packet may be assigned a timestamp (not shown in FIG. 2) that indicates the time of arrival in the monitoring probe. For this purpose, the timestamp of the previously processed RTP packet may be temporarily maintained (even after deleting the previous RTP packet—see step 309).

Further, the monitoring probe can determine and update 305 information on the jitter of the IATs of RTP packets of the given media stream based on the IAT determined in step 304. Moreover, the monitoring probe may further analyze 306 the payload type and may record changes of the payload type indicated in the RTP header of the RTP packets and/or may update a corresponding statistic.

Further, another transport metric(s) that is/are determined 307 by the monitoring probe are loss information. For example, by comparing the sequence number of the currently processed RTP packet to the sequence number of the previous RTP packet (this information being temporarily maintained for this purpose in the monitoring probe), packet loss can be determined. Moreover, the sequence number of the currently processed RTP packet can also be compared to sequence numbers of previous RTP packets (this information being temporarily maintained for this purpose in the monitoring probe), in order to detect reordering of the packets, packet duplicates, packets losses, etc.

In a further step 308, the RTP timestamp of the RTP packet is analyzed to determine packet interval and speech sampling. This information is also added/updated in the media stream context accordingly.

After having extracted transport related metrics from the RTP packet, as exemplified in steps 304 to 308 above, the RTP packet can be deleted 309 and the subsequent analysis is performed based on the extracted transport related metrics. This way, the amount of data that needs to be stored in memory of the monitoring probe is significantly reduced, as only a "summary" on the transport metrics needs to be maintained for further processing.

The second part of the analysis of the media stream will be done for pre-determined time intervals. This ensures that quality information (and especially, impairment information, which are of particular interest) is available in a high granularity for every media stream of a call. The media stream quality is estimated for pre-determined time segments (or intervals).

The duration of these pre-determined time intervals or segments may be configured by the user via some configuration software interface. In one example, the segments or time intervals for which the media quality is estimated is in the order of a few seconds, e.g. 5 seconds. I.e. taking the example of 5 seconds, the media stream quality of each media stream is estimated based on the media stream's data packets received at the monitoring probe within a given 5 second interval.

Segments of 5 seconds may be advantageous as this time interval provides a compromise between system utilization and in-call quality determination. For VoIP services, the packet intervals (i.e. the intervals in which the media encoder (generate media payload, which is ideally the interval in which the devices of the participants inject IP packets including the media payload on the network) are typically between 5 ms and 90 ms. This means that over a 5 second time interval media stream analysis would have to process between 1000 and 56 packets per 5 second interval.

The configured time interval should ensure that all data packets arriving within the configured time interval can be processed within the same period of time, so that—advantageously—only data packets of the time interval currently evaluated/processed and the arriving data packets of the next time interval have to be buffered.

Figure 4:
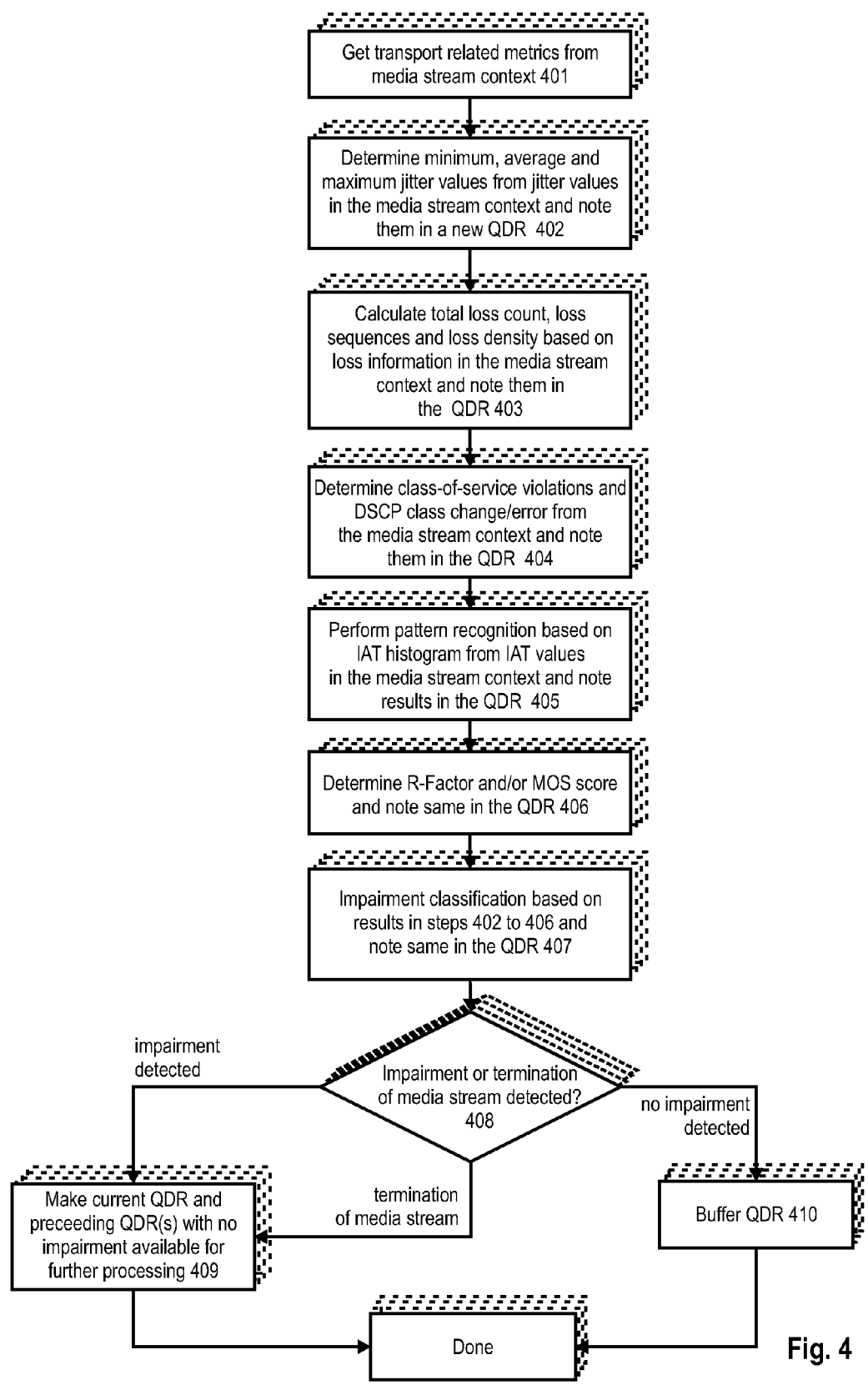
FIG. 4 shows a flow chart according to an embodiment of the invention to illustrate how in pre-configured time intervals, transport metrics collected from individual RTP packets, stored in the media stream context, are evaluated in the context of the media stream to create a quality data record for the passed pre-configured time interval indicating if the quality is above or below pre-configured thresholds.

FIG. 4 shows a flow chart of the second part of the analysis of the media stream according to an exemplary embodiment of the invention. It is also important to understand that the pre-determined time interval will be applied to all currently processed streams at the same time. This way impairments affecting more than one media stream at the same time can be detected. For this purpose, the pre-determined time interval are advantageously aligned by means of a wall-clock, and not to the timestamp of the first RTP packet of a respective media stream. In case the monitoring probe has a multi-core processing architecture, it may be advantageous to distribute currently active media streams evenly on all available CPU cores of the target hardware.

The second part of the analysis of the media stream can be considered to provide a further evaluation and/or summary of the transport metrics that are available in the media stream context for a given pre-determined time interval. This analysis also includes an estimation of the quality of the media stream within the pre-determined time interval, which can be either a transport quality or a media quality. The transport quality of the media stream within a pre-determined time interval may be for example expressed by minimum, average and maximum values for jitter, packet loss, packet loss length, inter-arrival times, discarded packets and the like, covering the full length of the pre-configured time interval. Considering all the aforementioned transport quality metrics, the media quality can be determined to reflect the estimated speech quality of a media stream up to this point in time. In one exemplary implementation, the media quality is estimated by calculating the R-factor and/or the MOS score for media stream or a user experience quality for the respective pre-determined time interval based on the transport metrics in the media stream context.

In one exemplary implementation according to an embodiment of the invention, at least one of the following performance indicators is determined for each media stream and for each pre-determined time interval from the transport metrics of the respective media stream:

Packet interval
Minimum, average and maximum jitter values
Burstiness of packet loss
Total packet loss
Packet sequence violations
DSCP class violations
Pattern recognition based on packet inter-arrival time distribution
Classification of sender and network related impairments
Determining an R-factor and MOS score
Determining overall user experience quality
Determining overall transport quality The performance indicator(s) generated in the second part of the analysis may be stored by the monitoring probe together with the packet level information of the first part of the analysis, in a record, which is also referred to as a quality data record (QDR).

The exemplary flow chart shown in FIG. 4 is performed on all active media streams monitored by the monitoring probe every pre-determined time interval, e.g. every 5 seconds. Once the process is triggered, the monitoring probe obtains 401 the transport related metrics of the respective media stream from its media stream context. The transport metrics obtained from the media stream context relate to the evaluation of the RTP packets that have been received in the last pre-determined time interval, e.g. the last 5 seconds.

Based on the obtained quality metrics, the monitoring probe determines performance indicators, which allow estimating the media stream quality in terms of its transport quality and/or its media quality. Again, not all steps 402 to 407 are necessarily performed, except those steps needed to determine the media stream quality in terms of calculating an R-factor or MOS score. Similarly, it is also possible to perform some or all of steps 402 to 407 in an arbitrary order.

In step 402 the minimum, average and maximum jitter of the RTP packets (see step 305 of FIG. 3) received within the within the last pre-determined time interval, e.g. the last 5 seconds, are added to a quality data record (QDR) for the last pre-determined time interval. Moreover, the number of lost packet (loss count) in the last pre-determined time interval, the maximum number of packets lost in a sequence and a loss density may also be determined 403 by the monitoring probe based on the transport metrics obtained from the media stream context, as well as the estimated number of discarded packets which are caused due to high jitter values. Also this information may be added to the QDR.

Further, it may be determined 404 if there has been and/or how many class-of-service violations occurred in the last pre-determined time interval and/or if and/or how many DSCP class changes or errors occurred within the last pre-determined time interval. Again, this information may be noted in the QDR. Moreover, based on an IAT histogram of the RTP packets received within the last pre-determined time interval, a pattern recognition may be performed 405 by the monitoring probe, which allows the identification of certain error causes in the network and media source of the media stream. Error causes detected in this fashion may also be noted in the QDR.

Furthermore, the transport metrics available on the RTP packets received within the past pre-determined may be further used to calculate 406 an R-factor and/or a MOS score for the past pre-determined time interval of the media stream. The R-factor and MOS score may be considered indicative of the media quality, respectively, the speech quality.

Moreover, the monitoring probe may also classify 407 the QDR based on the evaluation results of steps 402 to 406. This classification basically identifies the QDR to indicate an impairment of the media stream in the last pre-determined time interval or not. This classification may be further used to decide in step 408, how the generated QDR should be further processed.

In case the current QDR has been judged 408 to be indicative of an impairment of the media stream within the associated pre-determined time interval, the any buffered QDRs yielding no impairment (see step 410) and optionally the current QDR (e.g. if not empty) are made available 409 for further processing.

In case it is determined in step 408 that the media stream has terminated, the current QDR (irrespective of whether it indicates an impairment or not) is output 409 together with any buffered QDRs yielding no impairment (see step 410), if present. It should be noted that in one exemplary implementation not shown in FIG. 4, there may be a further evaluation in between steps 401 and 402, that determines based on the transport metrics whether any RTP packets for the media stream have been received in the past pre-determined time interval, e.g. the last 5 seconds. The termination of a media stream could be for example indicated by a termination flag set in the media stream context. If it is determined for a threshold number of times (e.g. 1, 2, 3, 4 or 5) in a row that no RTP packets for the media stream have been received in the respective past pre-determined time interval, the media stream may be judged to be terminated and the process may directly jump to step 408. In this case, step 409 outputs only buffered QDRs yielding no impairment (see step 410), if present.

In case it is judged 408 that the current QDR is indicating no impairment of the media stream, the QDR may be buffered 410 for a predetermined amount of time. For example, the QDR referring to the last couple of minutes (e.g. up to 10 minutes, 15 minutes, 20 minutes, or the like) may be buffered, if they yield no impairment and are not provided for further processing in step 409 due to an intermediate QDR indicating an impairment of the media stream. The buffered QDRs may also be combined with each other so as to refer to larger periods in multiples of said pre-determined time interval in order to safe storage. In order to indicate the period in time to which the QDR refers to, same may further include a timestamp indicative of the start of the first pre-determined time interval to which the QDR refers to and a timestamp indicative of the end of the last pre-determined time interval to which the QDR refers to. In case of a QDR indicating impairment, the QDR first pre-determined time interval and last pre-determined interval are the same interval; only when QDRs yielding no impairment are aggregated, these time intervals are different from each other.

Figure 5:
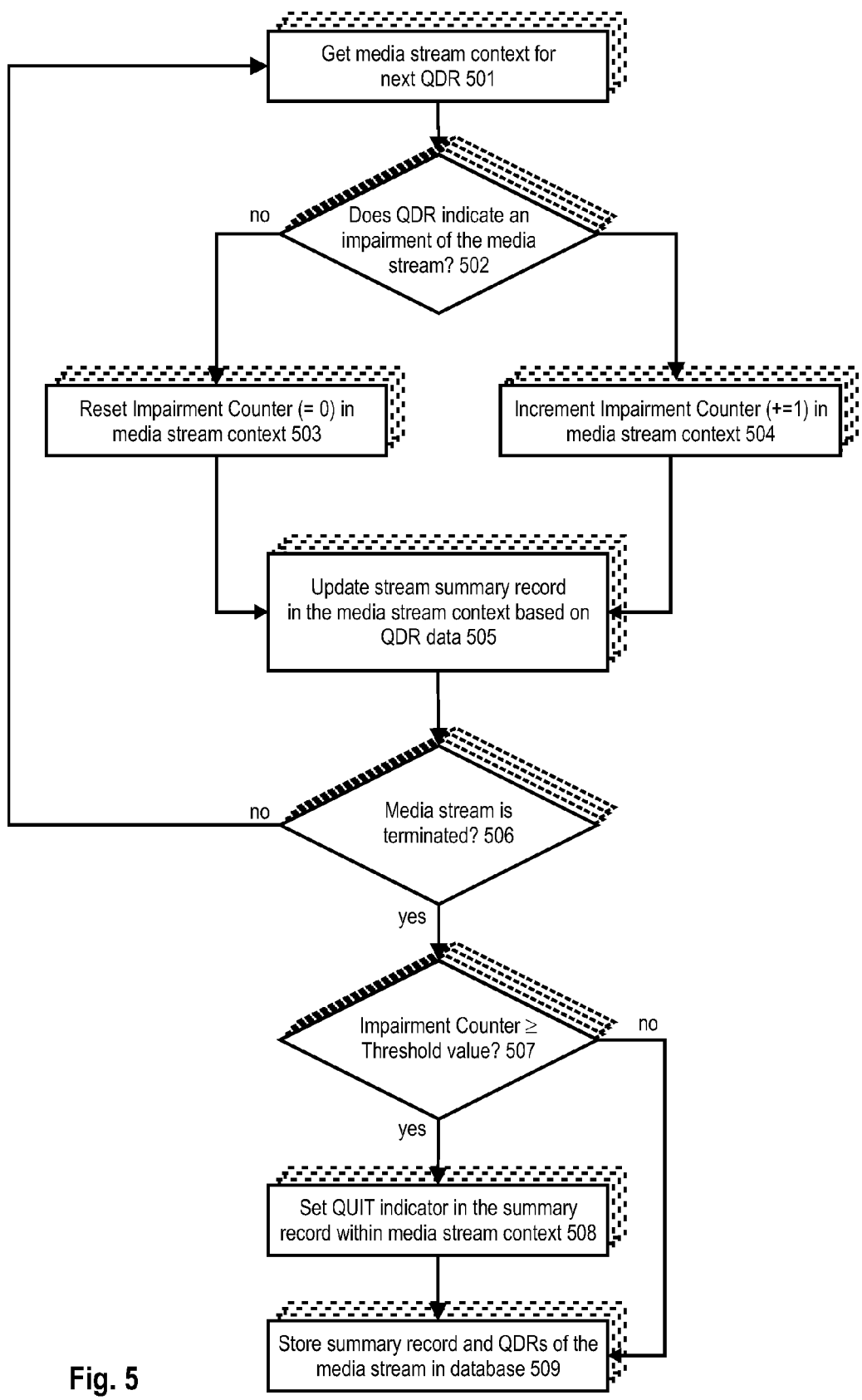
FIG. 5 shows a flow chart according to an embodiment of the invention to illustrate how individual quality data records created for pre-configured time intervals are combined to create a media stream summary, which includes a QUIT indicator.

A new QDR (or optionally multiple QDRs) made available may be further processed according to the exemplary flow chart of FIG. 5 in order to facilitate the detection of quality imposed terminations of media streams. FIG. 5 shows a flow chart of a further analysis of generated QDRs according to an embodiment of the invention. It should be noted that the process of FIG. 5 may be performed in parallel in several instances. Furthermore, the process of FIG. 5 is also not limited to receiving QDRs only from a specific media stream, but QDRs of any media stream can be processed.

The procedure in FIG. 5 is controlling an impairment counter which allows to judge whether a termination of the media stream is quality induced or not. Moreover, it should be noted that in case multiple QDRs are made available, they are processed in the timely correct order of their generation (oldest QDR is to be processed first).

For a QDR to be processed next, the monitoring probe obtains 501 the media stream context of the media stream to which the QDR relates. Again this identification may be based on the stream hash value, which must be available in each QDR. Next, it is determined 502, whether the QDR indicates an impairment of the media stream or not. This may be for example achieved by evaluating an impairment classification (which may be a flag or an indicator with higher granularity) against a threshold value. Another option is to compare the MOS score or R-factor against a threshold value. For example, a MOS score below a threshold of 3.1 may be considered to yield an impairment of the speech quality of the stream. Optionally, the threshold value against which the estimated quality of the media stream is compared may be configurable by the operator of the monitoring probe.

If the QDR yields an impairment of the media stream, the monitoring probe increments 504 an impairment counter of the media stream, which is maintained in the media stream context. Upon generation of the media stream context, the impairment counter may be initialized to zero. Furthermore, in case the QDR yields no impairment of the media stream, the monitoring probe resets 503 the impairment counter of the media stream in the media stream context to its initial value (e.g. zero).

Moreover, in step 505 a summary record of the media stream, which is aggregating QDR level information to media stream level information, is updated by the information contained in any new QDR made available for the media stream during the media stream's lifetime. The summary record can be used to rate the estimated quality of the media stream. Measurement metrics determined on QDR level, may be further combined into the summary record to determine minimum, average and maximum values for each metric on the media stream level, as well as to determine a collection of all impairments that have been found over the duration of the stream.

Next it may be determined, whether or not the media stream has been terminated or not 506. A corresponding indication (see step 408) may be made available though a termination flag in the media stream context or alternatively the process shown in FIG. 4 may inform the process in FIG. 5 on this event. In case a media stream is not yet terminated, the next available QDR is processed. Otherwise, the impairment counter is checked against a threshold value (e.g. 2, 3, 4 or 5). Basically, due to the way how the impairment counter is incremented and reset according to steps 504 and 503, the impairment counter value yields how many of the lastly generated QDRs (in a row) for a media stream before its termination yield an impairment (i.e. a "bad quality") of the media stream. It is concluded that if a given threshold number of the last generated QDRs for the given steam yield an impairment of the media stream, the cause for the termination of the media stream has been the impairment over a threshold time period (i.e. threshold number times duration of the pre-determined time interval for which a QDR is generated).

Hence, in case the impairment counter is equal to or higher than a threshold value, it is concluded that the termination of the media stream was due to "bad quality" and a QUIT indicator in the summary record of the media stream is set 509 to indicate this conclusion. If the impairment counter is lower than the threshold value, the QUIT indicator in the summary record remains unset. The summary record and QDRs available in the media stream context of the stream are then stored 510 in a database and may be removed from the volatile memory of the monitoring probe.

Again the processing of media stream context information and the generation of a summary record for the media stream may be performed in parallel, which may be distributed to CPU cores available in the monitoring probe. This may allow for the processing of many thousand terminated media streams concurrently. The summary records and QDRs available in the media stream context of the terminated media streams may be made available to further post-processing through storing it in a database, as noted above.

Using the procedures described above, it can be ensured that each monitored media stream that is terminated is flagged with a QUIT indicator, in case its termination was attributed to a bad quality of the media stream.

The QUIT indicator can be used on a per-stream or per-session basis to trigger alarms in the passive monitoring system. Every summary record of each media stream has a QUIT indicator (set to true or false) attached to it.

Using the QUIT indicators in the summary records of the terminated media streams, either the monitoring probe or another post-processing platform may for example calculate a ratio $R_{stream}$ between the number $N_{QUIT=1}$ of media streams terminated due to bad quality (i.e. having the QUIT indicator set) versus the number $N_{QUIT=0}$ of media streams not terminated due to bad quality (i.e. having the QUIT indicator not set):

$$R_{stream} = N_{QUIT=1} / N_{QUIT=0}$$

If this ratio $R_{stream}$ exceeds a certain threshold value, an alarm may be triggered in the monitoring system and is for example notified to an operator using a graphical user interface. The ratio may be for example determined in regular intervals $T_k$ (e.g. in the order of several minutes) for the media streams that have been terminated within the respective time interval:

$$R_{stream}(k) = N_{QUIT=1}(k) / N_{QUIT=0}(k)$$

In this case, the ratio can be also considered equivalent to a termination rate $r_{stream}(k)$ due to its correlation to a given time interval $T_k$ (where k is an index to distinguish the time intervals and $t_k$ denotes the length of each interval $T_k$):

$$r_{stream}(k) = \frac{N_{QUIT=1}(k) / N_{QUIT=0}(k)}{t_k}$$

In a further embodiment of the invention, a QUIT indicator for a communication session (e.g. a phone call between two parties) is determined based on the per-stream QUIT indicators. The aggregation of the QUIT indicators on the communication session level can provide a more accurate metric on the cause of the termination of the communication sessions, since also media streams of a call for which no QUIT flag is set can be concluded to be terminated due to bad quality of another media stream of the communication session. A conversation between two or more parties is typically aborted if the stream quality on one side suffers. As a result the entire communication session—and not only an individual media stream or streams thereof—can be flagged as being terminated due to bad quality, e.g. if one media stream has the QUIT indicator set.

In order to correlate multiple media streams to a single communication session the passive monitoring system may use signaling session information of the communication session. These signaling sessions may be passively monitored by the same monitoring system or provided by third parties, and may be described through so-called extended data records describing the signaling sessions. The correlation process uses the IP transport information and potentially available other identifiers in the signaling plane and media plane of a communication session to match a plurality of media streams to the communication session. For details, on how media streams may be correlated to a signaling session, respectively, the communication session they belong to, it is referred to the co-pending European patent application no. 10 015 622.3, filed Dec. 14, 2010 by the same applicant and PCT application no. PCT/EP2011/002145, filed Apr. 28, 2011 by the same applicant, which are both incorporated herein by reference.

When having determined which media streams belong to a communication session, the entire communication session may be attributed a per-session QUIT indicator set to true, if one or more media streams which were active at the end of the communication session have the QUIT indicator set in their summary record. Using the QUIT indicators on the media stream level, either the monitoring probe or another post-processing platform may for example calculate a ratio $R_{session}$ between the number $M_{QUIT=1}$ of communication session terminated due to bad quality (i.e. having the QUIT indicator set) versus the number $M_{QUIT=0}$ of communication session not terminated due to bad quality (i.e. having the QUIT indicator not set):

$$R_{session} = M_{QUIT=1} / M_{QUIT=0}$$

If this ratio $R_{session}$ exceeds a certain threshold value, an alarm may be triggered in the monitoring system and is for example notified to an operator using a graphical user interface. The ratio may be for example determined in regular intervals $T_k$ (e.g. in the order of several minutes) for the communication sessions that have been terminated within the respective time interval:

$$R_{session}(k) = M_{QUIT=1}(k) / M_{QUIT=0}(k)$$

In this case, the ratio can be also considered equivalent to a termination rate $r_{session}(k)$ due to its correlation to a given time interval $T_k$ (where k is again an index to distinguish the time intervals and $t_k$ again denotes the length of each interval $T_k$):

$$r_{session}(k) = \frac{M_{QUIT=1}(k) / M_{QUIT=0}(k)}{t_k}$$

Using a session-based QUIT ratio or rate instead of a media stream based QUIT ratio or rate it is possible to increase the accuracy of the monitoring system as it absorbs events during the calls which prevent proper calculation of a QUIT ratio on a stream basis such as early media (ring tones) and the fact that on a stream basis the operator does not know whether the media stream having a QUIT indication set to true, is really the last media stream of a communication session, causing a communication session to get terminated due to bad quality on one direction of the communication session.

The term probe or any other network device implementing the principles of the invention may be considered to refer to dedicated hardware, a software program or a combination thereof to implement the desired functionality of the respective probe, respectively, network device. Accordingly, another embodiment of the invention relates to the implementation of the above described various embodiments using hardware and software. It is recognized that monitoring probes and network devices may be implemented by having computing devices (processors) execute a software program that causes the desired functionality being executed. A computing device or processor may for example be general purpose processors, digital signal processors (DSP), application specific integrated circuits (ASIC), field programmable gate arrays (FPGA) or other programmable logic devices, etc. Some of the computing devices may store the software program internally.

The various embodiments of the invention may also be performed or embodied by a combination of computing devices and software programs providing the desired functionality stored on any kind of computer readable storage media, for example RAM, EPROM, EEPROM, flash memory, registers, hard disks, CD-ROM, DVD, etc.

It should be further noted that the individual features of the different embodiments of the invention may individually or in arbitrary combination be subject matter to another invention.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method for detecting quality induced terminations of media streams of real-time communication sessions within a packet-switched network, the method comprising:
    monitoring by a midpoint passive monitoring system, connected to the packet-switched network, packets of a plurality of media streams of the real-time communication sessions between endpoints, wherein monitoring comprises generating, for pre-configured time intervals, quality data records for each monitored media stream, wherein each quality data record is indicative of an estimated media stream quality of the respective media stream within the respective pre-configured time interval,
    detecting a termination of one of the media streams;
    determining that said termination is a quality induced termination of said one terminated media stream when a predetermined threshold number of the lastly generated quality data records for said one terminated media stream are each indicative of an estimated media stream quality for the respective pre-configured time interval below a media stream quality threshold level.

2. The method according to claim 1, wherein monitoring a plurality of media streams received by the real-time midpoint passive monitoring system comprises:
    determining transport-related metrics for each of the media streams for respective pre-configured time intervals and
    estimating the media stream quality for each of the media streams within each respective pre-configured time interval.

3. The method according to claim 2, wherein the estimated media stream quality is an estimated speech quality.

4. The method according to claim 3, wherein the step of estimating the media stream quality comprises determining a Mean Opinion Score (MOS) or R-factor value for each media stream in each pre-configured time interval, and
    a quality induced termination of a media stream is determined based on the Mean Opinion Score (MOS) or R-factor value.

5. The method according to claim 2, wherein estimated media stream quality is an estimated transport quality determined based on at least one of packet loss, jitter, deviations in packet inter-arrival times, packet delay, and sequence errors in the received packet sequence.

6. The method according to claim 1, further comprising:
    calculating the media stream termination ratio of the number of media streams, the termination of which is determined to be quality induced, and the number of media streams, the termination of which is not determined to be quality induced,
    generating an alert in case the media stream termination ratio exceeds a predetermined termination ratio.

7. The method according to claim 6, wherein the media stream termination ratio is calculated for media streams conveying video data only or for media streams conveying voice data only.

8. The method according to claim 6, wherein the media stream termination ratio is calculated in intervals.

9. The method according to claim 1, further comprising:
    maintaining a media stream context for each media stream, wherein a quality induced termination indicator that indicates whether termination of the respective media stream has been determined to be quality induced or not is added to the media stream context upon termination of the respective media stream.

10. The method according to claim 8, wherein the monitored media streams belong to different communication sessions and the method further comprises:
    correlating for each terminated communication session the media stream contexts of the media streams belonging to each respective terminated communication session,
    for each terminated communication session, judging the termination of a respective communication session to be quality induced, in case at least one media stream context of a media stream being active upon termination of said respective terminated communication session indicates a quality induced termination, and, otherwise, judging the termination of said respective communication session not to be quality induced,
    calculating the communication session termination ratio of the number of communication session the termination of which is judged to be quality induced, and the number of media streams, the termination of which is judged not to be quality induced,
    generating an alert in case the communication session termination ratio exceeds a predetermined termination ratio.

11. The method according to claim 10, wherein the communication session termination ratio is calculated in intervals.

12. The method according to claim 9, wherein the media stream context further comprises quality data records of a respective terminated media stream that indicate an estimated speech quality for the respective predetermined time interval of a respective quality data record to be below said quality threshold level and
    the step of determining a quality induced termination of said one terminated media stream comprises determining whether there is a predetermined number of lastly generated and consecutive quality data records comprised in the media stream context of said one terminated media stream that each indicate the estimated speech quality to be below said quality threshold, and if so, determining that the termination of said one terminated media stream is quality induced.

13. The method according to claim 1, wherein the step of monitoring the plurality of media streams comprises:
    determining, upon the generation of a new quality data record for a respective media stream of said plurality of media streams, whether the estimated media stream quality of the respective media stream indicated by said new quality data record is below said quality threshold level or not, incrementing a counter value for said respective media stream, in case the estimated media stream quality of said respective media stream indicated by said new quality data record is below said quality threshold level, resetting the counter value for said respective media stream to zero, in case the estimated media stream quality of said respective media stream indicated by said new quality data record is not below said quality threshold level, and wherein the step of determining a quality induced termination of said one terminated media stream determines a quality induced termination of said one terminated media stream, in case the counter value for said one terminated media stream is higher than said predetermined threshold number.

14. The method according to claim 13, wherein the media stream context further comprises quality data records of a respective terminated media stream that indicate the estimated media stream quality for the respective pre-configured time interval of a respective quality data record to be below said quality threshold level.

15. The method according to claim 1, wherein the pre-configured time intervals in which quality data records are generated for the plurality of media streams are time aligned for the plurality of media streams.

16. An apparatus for detecting quality induced terminations of media streams of real-time communication sessions within a packet-switched network, the apparatus comprising:
a memory storing code; and
a hardware processor coupled to the memory for executing the code, the code comprising:
instructions to monitor packets of a plurality of media streams of the real-time communication sessions between endpoints at a midpoint in the packet-switched network;
instructions to generate, for pre-configured time intervals, quality data records for each monitored media stream, wherein each quality data record is indicative of an estimated media stream quality of the respective media stream within the respective pre-configured time interval, and
instructions to detect a termination of one of the media streams;
instructions to determine that said termination is a quality induced termination of said one terminated media stream when a predetermined threshold number of the lastly generated quality data records for said one terminated media stream are each indicative of an estimated media stream quality for the respective pre-configured time interval below a media stream quality threshold level.

17. The apparatus according to claim 16, wherein the apparatus comprises a monitoring probe or a session border controller, a media gateway or a Real-time Transport Protocol (RTP)-aware network device.

18. A passive monitoring system for detecting quality induced terminations of media streams of real-time communication session within a packet-switched network, the passive monitoring system comprising:
a memory storing code; and
a hardware processor coupled to the memory for executing the code, the code comprising: instructions to monitor at a midpoint in the packet-switched network packets of a plurality of media streams of the real-time communication sessions between endpoints in the packet-switched network,
instructions to generate, for pre-configured time intervals, quality data records for each monitored media stream, wherein each quality data record is indicative of an estimated media stream quality of the respective media stream within the respective pre-configured time interval,
instructions to detect a termination of one of the media streams; and
instructions to determine, in response to the detection of said termination, a quality induced termination of said one terminated media stream when a predetermined threshold number of the lastly generated quality data records for said one terminated media stream each indicative of an estimated media stream quality for the respective pre-configured time interval below a media stream quality threshold level.

19. The passive monitoring system according to claim 18, wherein the monitored media streams belong to different communication sessions, wherein said code comprising further comprising:
instructions to correlate for each terminated communication session the media stream contexts of the media streams belonging to each respective terminated communication session,
instructions to judge, for each terminated communication session, the termination of a respective communication session to be quality induced, in case at least one media stream context of a media stream being active upon termination of said respective terminated communication session indicates a quality induced termination, and, otherwise, judging the termination of said respective communication session not to be quality induced,
instructions to calculate the communication session termination ratio of the number of communication sessions the termination of which is judged to be quality induced, and the number of communication sessions, the termination of which is judged not to be quality induced,
instructions to generate an alert in case the communication session termination ratio exceeds a predetermined termination ratio.

20. A non-transitory computer-readable medium storing instructions that, when executed by a hardware processor of an apparatus, cause the apparatus to detect quality induced terminations of media streams of real-time communication sessions within a packet-switched network, wherein said transitory computer-readable medium comprising computer executable instructions for performing the following:
monitoring by a midpoint passive monitoring system connected to the packet-switched network, packets of a plurality of media streams of the real-time communication sessions between endpoints, wherein monitoring comprises generating, for pre-configured time intervals, quality data records for each monitored media stream, wherein each quality data record is indicative of an estimated media stream quality of the respective media stream within the respective pre-configured time interval, and
detecting a termination of one of the media streams,
determining that said termination is a quality induced termination of said one terminated media stream when a predetermined threshold number of the lastly generated quality data records for said one terminated media stream are each indicative of an estimated media stream quality for the respective pre-configured time interval below a media stream quality threshold level.

* * * * *